US012574046B2

(12) United States Patent
Cala' et al.

(10) Patent No.: US 12,574,046 B2
(45) Date of Patent: Mar. 10, 2026

(54) BUS CONTROL FOR DC/DC CONVERTERS

(71) Applicant: STMicroelectronics International N.V., Geneva (CH)

(72) Inventors: Ignazio Cala', Syracuse (IT); Roberto Lanza, Catania (IT)

(73) Assignee: STMicroelectronics International N.V., Geneva (CH)

( * ) Notice: Subject to any disclaimer, the term of this patent is extended or adjusted under 35 U.S.C. 154(b) by 76 days.

(21) Appl. No.: 18/609,686

(22) Filed: Mar. 19, 2024

(65) Prior Publication Data

US 2025/0300670 A1 Sep. 25, 2025

(51) Int. Cl.
H03M 1/82 (2006.01)
H03M 1/06 (2006.01)

(52) U.S. Cl.
CPC ......... H03M 1/825 (2013.01); H03M 1/0607 (2013.01)

(58) Field of Classification Search
CPC ........ H03M 1/06; H03M 1/82; H03M 1/0607; H03M 1/825
See application file for complete search history.

(56) References Cited

U.S. PATENT DOCUMENTS

| | | | | | |
|---|---|---|---|---|---|
| 5,212,484 | A | * | 5/1993 | Hillis | G06F 1/10 341/118 |
| 5,714,955 | A | * | 2/1998 | Reay | H03M 1/002 341/126 |

| | | | | | |
|---|---|---|---|---|---|
| 6,549,156 | B1 | * | 4/2003 | Moser | H03M 1/0607 341/120 |
| 7,002,266 | B1 | | 2/2006 | Adkins et al. | |
| 7,129,867 | B2 | * | 10/2006 | Kim | H03M 1/1295 341/120 |
| 7,271,649 | B2 | * | 9/2007 | Chiu | H03F 1/02 330/307 |
| 7,460,049 | B2 | | 12/2008 | Kuo | |
| 7,639,165 | B2 | * | 12/2009 | Sutardja | H03M 1/1019 341/120 |
| 7,683,596 | B1 | | 3/2010 | Kaplish | |
| 7,756,495 | B2 | * | 7/2010 | Sumesaglam | H04L 25/06 455/343.1 |
| 11,398,780 | B2 | | 7/2022 | Cho et al. | |
| 2002/0194516 | A1 | | 12/2002 | Muratov et al. | |
| 2006/0001558 | A1 | * | 1/2006 | Kim | H04L 25/063 341/118 |
| 2006/0077003 | A1 | * | 4/2006 | Chiu | H03F 3/45973 330/9 |
| 2007/0072568 | A1 | * | 3/2007 | Sumesaglam | H04L 25/06 455/230 |

(Continued)

*Primary Examiner* — Lam T Mai

(74) *Attorney, Agent, or Firm* — Slater Matsil, LLP

(57) ABSTRACT

A converter system is disclosed. The converter system including a system controller; a plurality of circuit elements configured to operate in response to control signals from the system controller; a bus controller configured to transmit data to a communication bus; and a plurality of power converters, each including a digital to analog converter (DAC) configured to generate an analog voltage for one or more of the circuit elements based on a digital signal on the communication bus; a digital module configured to receive digital data from the bus controller on the communication bus; and an amplifier, configured to adjust an offset according to an offset compensation code received from the digital module.

20 Claims, 6 Drawing Sheets

(56) References Cited

U.S. PATENT DOCUMENTS

| | | | | |
|---|---|---|---|---|
| 2009/0033534 | A1* | 2/2009 | Kobayashi | H03M 1/0607 |
| | | | | 341/150 |
| 2009/0040079 | A1* | 2/2009 | Sutardja | H03M 1/1019 |
| | | | | 341/120 |
| 2009/0189798 | A1* | 7/2009 | Sasaki | H03M 1/08 |
| | | | | 341/161 |
| 2012/0092198 | A1* | 4/2012 | Ali | H03M 1/0863 |
| | | | | 341/118 |
| 2013/0113450 | A1 | 5/2013 | Tang et al. | |
| 2017/0141676 | A1* | 5/2017 | Gerna | H02M 1/088 |
| 2018/0367051 | A1 | 12/2018 | Agamy et al. | |
| 2019/0086633 | A1* | 3/2019 | Kim | H04N 23/6812 |
| 2020/0228012 | A1* | 7/2020 | Lynch | H02M 3/158 |
| 2024/0288918 | A1* | 8/2024 | Keiper, III | G06F 1/26 |

* cited by examiner

BUS CONTROL FOR DC/DC CONVERTERS

TECHNICAL FIELD

The present disclosure generally relates to controlling a set of DC/DC converters, as well as to determining parameters for the DC/DC converters.

BACKGROUND

Some systems use a number of DC/DC converters to generate multiple voltages for the system. For example, a system may need a number of power or reference voltages, and a set of DC/DC converters may be used to generate the needed power and reference voltages. Sometimes the DC/DC converters may be programmable.

SUMMARY

One embodiment is a converter system, including a system controller; a plurality of circuit elements configured to operate in response to control signals from the system controller; a bus controller configured to transmit data to a communication bus; and a plurality of power converters, each including a digital to analog converter (DAC) configured to generate an analog voltage for one or more of the circuit elements based on a digital signal on the communication bus; a digital module configured to receive digital data from the bus controller on the communication bus; and an amplifier, configured to adjust an offset according to an offset compensation code received from the digital module.

Another embodiment is a converter system, including a bus controller configured to transmit data to a communication bus; and a plurality of power converters, each including a digital to analog converter (DAC) configured to generate an analog voltage based on a digital signal on the communication bus; a digital module configured to receive digital data from the bus controller on the communication bus; and an amplifier, configured to adjust an offset according to an offset compensation code received from the digital module.

Another embodiment is a method of using a converter system, the method including causing a plurality of circuit elements to operate in response to control signals from a system controller; transmitting data to a communication bus for a plurality of data converters connected to the communication bus; and with each of a plurality of power converters generating an analog voltage for one or more of the circuit elements based on a digital signal on the communication bus; and adjusting an offset of an amplifier according to an offset compensation code received from the communication bus.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

Figure 1:
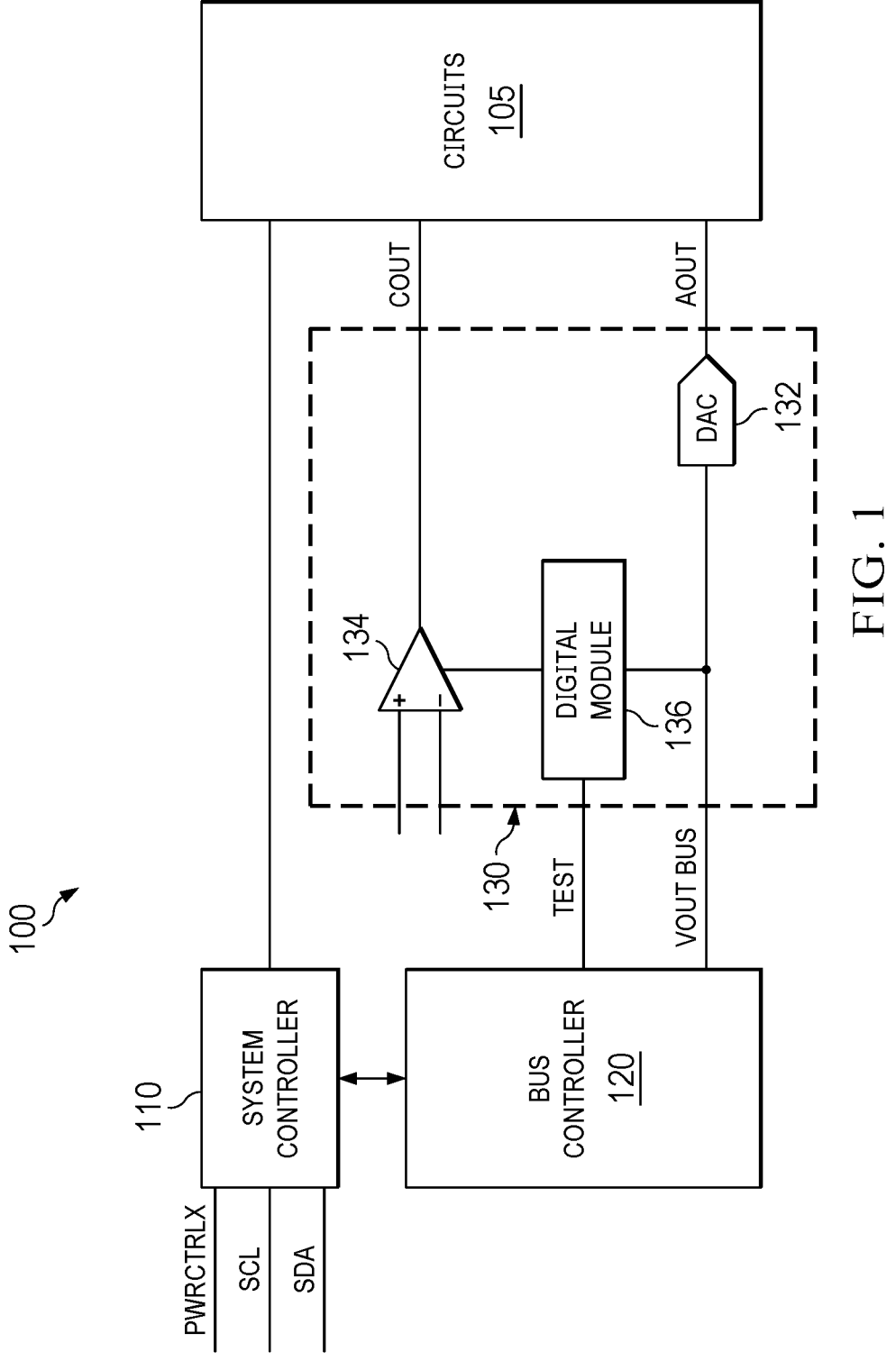
FIG. 1 shows a schematic circuit block diagram of a DC/DC converter system according to some embodiments.

Corresponding numerals and symbols in the different figures generally refer to corresponding parts unless otherwise indicated. The figures are drawn to illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

In some embodiments, it is possible to share and to re-use for different purposes the bus for a group of DC/DC converters to drive and change by software the output voltage or other parameters of each of the DC/DC converters.

In some embodiments, each DC/DC converter as one or more comparators that may be calibrated (e.g., to compensate for native offset) for correct operation. For this reason, a digital module, such as a counter, may be used to provide data or control signals that control a number of analog switches which serve to balance current in a branch of the comparator to remove offset, for example, in an auto-calibration process. The auto-calibration process may occur in an automatic mode of the DC/DC converter, for example, as part of a start-up sequence.

In some situations, it may be very useful to read-back the control word stored inside the digital module set during the auto-calibration. In some situations, it may be very useful to set a different control word in the digital module, for example, to check the correct behaviour of the comparator and/or for debugging purposes. For reading the control word, one approach is to carry-out the bits of the digital module, for example, to a dedicated status register inside a Digital Controller, such as a Digital Top of device, but this approach needs a large number of interconnections and wires causing routing congestion and excess silicon area.

Some embodiments avoid the problems described above by using the VOUT bus and the clock signal already present inside the multiple DC/DC converter system without adding a large number of wires.

In some embodiments, for example, at the end of an auto-calibration phase, the control word stored inside the digital module is frozen and stable. In some embodiments, it is possible to enter in a device test mode and to drive the VOUT bus with a counting signal starting from zero until to its overflow. In some embodiments, the digital module has a bit-size equal to or less than the bit-size of the VOUT bus.

While the VOUT bus is driven with the counting signal, the VOUT bus counting signal and the word inside the digital module are compared. In some embodiments, once the VOUT bus counting signal matches the control word of the digital module, the VOUT counting signal is stopped. Reading the register used to drive the VOUT bus counting signal then matches the control word stored inside the digital module used to cancel or remove the offset of the amplifier or comparator.

In some embodiments, a new calibration word may be loaded into the digital module using the VOUT bus, for example, for debugging purposes in a test mode. In the test mode, the VOUT bus may be driven with a new control word, which is transferred loaded into the digital module with control signals, and the new control word replaces the previous calibration word stored in the digital module.

In some embodiments, users would like to evaluate or measure an output voltage of the DC/DC converter for each digital input step. Also, for this purpose the VOUT bus may be used by applying a counting signal thereto in response to a clock signal applied, for example, to an external pin. See, for example, the PWRCTRLx device inputs discussed below. With this solution is possible to provide a clock signal to the device, and, in response to the clock signal, the DAC output of the DC/DC converter steps through voltages corresponding with the counting signal applied to the VOUT bus.

FIG. 1 shows a schematic circuit block diagram of a DC/DC converter system 100 according to some embodiments. DC/DC converter system 100 includes system circuits 105, system controller 110, bus controller 120, and a plurality of DC/DC converters 130. DC/DC converter system 100 may be part of a system using multiple power and or reference voltages.

System circuits 105 may include any circuits which perform functions for generating one or more outputs. For example, in some embodiments, system circuits 105 include LEDs which operate with power voltages generated by the DC/DC converters 130. In some embodiments, system circuits 105 include circuit portions which operate with different power voltages generated by the DC/DC converters 130.

System controller 110 may control multiple components, circuits, and/or systems 105 of the system which DC/DC converter system 100 is a part of. System controller 110 also determines what voltages the DC/DC converters 130 are to generate, and generates output voltage control signals which cause each of the DC/DC converters 130 to generate a particular voltage designated by the control signals.

In some embodiments, system controller 110 is an I2C controller, and receives input signals according to an I2C standard. For example, in some embodiments, system controller 110 receives SDA and SCL signals. In some embodiments, system controller 110 also receives PWRCTRLx signals, which are used by system controller 110 to coordinate the functionality of the system controller 110 with one or more external devices. In some embodiments, one or more power control signals, such as the PWRCTRLx signals, may be used as a clock input signal to influence operation of DC/DC converter system 100 in one or more particular modes, as discussed in more detail below with reference to the various embodiments discussed herein. In some embodiments, PWRCTRLx signals, may additionally be used to transmit or receive other command or data information than the examples discussed herein. For example, in some embodiments, PWRCTRLx signals, may additionally be used for implementing functionality other than or unrelated to testing operations.

Bus controller 120 interfaces with system controller 110 to receive control signals. Based on the control signals, bus controller 120 generates control signals for the DC/DC converters 130.

In some embodiments, bus controller 120 generates control and data signals for the DC/DC converters 130 which cause the DC/DC converters 130 to function in the various operational modes. While details of particular operational modes are discussed, it is to be understood that other operational modes may be implemented.

In some embodiments, in the various operational modes, bus controller 120 may be configured to generate control and data signals for the DACs 132 and/or for the digital modules 136 of each of the DC/DC converters 130. For example, bus controller 120 may be configured to generate and communicate the control and data signals using either or both of the VOUT and the TEST communication paths.

In some embodiments, in the various operational modes, bus controller 120 may be configured to receive control and/or data signals from the DACs 132 and/or from the digital modules 136 of each of the DC/DC converters 130. For example, bus controller 120 may be configured to receive the control and data signals using either or both of the VOUT and the TEST communication paths.

In some embodiments, the TEST communication path includes one or more wires connected to bus controller 120 and to each of the digital modules 136. In some embodiments, one or more wires of the TEST communication path provide dedicated communication channels between the bus controller 120 and each of the digital modules 136. In some embodiments, one or more wires of the TEST communication path provide shared communication channels between the bus controller 120 and a group of digital modules 136, for example as a bus.

In some embodiments, the VOUT communication path includes one or more wires connected to bus controller 120, to each of the DACs 132, and to each of the digital modules 136. In some embodiments, one or more wires of the VOUT communication path provide dedicated communication channels between the bus controller 120 and each of the DACs 132 and digital modules 136. In some embodiments, one or more wires of the VOUT communication path provide shared communication channels between the bus controller 120 and a group of DACs 132 and digital modules 136, for example as a bus.

In the illustrated embodiment, each of the DC/DC converters 130 includes a DAC 132, a digital module 136, and an amplifier 134. In some embodiments, the amplifier 134 may be configured and used as a comparator.

Each of the DACs 132 is configured to receive a digital word from the bus controller 120 with the VOUT communication path. In addition, each of the DACs 132 is configured to generate analog voltages at one of the nodes AOUT corresponding with the digital words received. Various DAC configurations, topologies, architectures, and circuits may be used, and the implementation of the DACs 132 is not limited herein.

Each of the amplifiers 134 is configured to receive a positive input and a negative input. In addition, each of the amplifiers 134 is configured to generate an output voltage at one of the nodes COUT corresponding with an amplified difference between the positive input and the negative input. Various amplifier configurations, topologies, architectures, and circuits may be used, and the implementation of the amplifiers 134 is not limited herein.

Each of the digital modules 136 is configured to receive a digital word from the bus controller 120 with the VOUT communication path. In addition, each of the digital modules 136 is configured to generate control signals for a corresponding one of the amplifiers 134 according to the digital words received. In some embodiments, one or more of the digital modules is configured to generate a digital word for the bus controller 120 on the VOUT communication path.

In some embodiments, each of the digital modules 136 is configured to receive instruction signals from the bus controller 120 with the TEST communication path. In addition, each of the digital modules 136 may be configured to generate the control signals for the corresponding one of the amplifiers 134 according received instruction signals. In some embodiments, one or more of the digital modules is configured to generate a signal for the bus controller 120 on the TEST communication path.

In some embodiments, each of the amplifiers 134 is configured to receive the control signals from the corresponding digital module 136, and to function according to the received control signals. For example, as discussed in more detail below, a control signal from a corresponding digital module 136 may be an offset compensation code to adjust an offset of the corresponding amplifier 134. In alternative embodiments, other parameters of the corresponding amplifier 134 may be adjusted or controlled by the received control signals.

In some embodiments, bus controller 120 generates corresponding amplifier control signals which cause the DC/DC converters 130 to operate in an auto calibration mode.

During an auto-calibration mode, the amplifiers 134 are configured as comparators having a 0 v input. For example, in some embodiments, the positive input and the negative input of the amplifiers 134 are shorted. In some embodiments, bus controller 120 generates signals which cause the inputs to be shorted using one or more switches which are external to the DC/DC converter 130. In some embodiments, bus controller 120 generates one or more signals which causes digital module 136 to activate one or more switches internal to DC/DC converter 130 or internal to amplifier 134 which cause the inputs to be shorted.

In addition, during the auto calibration mode, bus controller 120 may be configured to successively program the digital modules 136 with a series of data words corresponding with a counting pattern. In addition, each of the digital modules 136 is configured, for example by signals received from bus controller 120 on the TEST communication path, to store the current count, and to provide the current count to the corresponding amplifier 134, where the current count may cause the amplifier 134 to generate a voltage output. While the current count is at or near a high or low extreme, the amplifier 134 generates a high or low voltage output voltage at the corresponding output node COUT. In response to the current count changing to a value corresponding with the voltage offset of the amplifier 134, the voltage output of the amplifier 134 changes from its initial high or low voltage output value to an opposite low or high voltage value. Bus controller 120 may be configured to monitor the output of the amplifier 134, and to stop changing the data word for the digital module 136 in response to the changed output of amplifier 134. As a result, the count value corresponding with and compensating for the offset voltage of the amplifier 134 persists in the digital module 136. In some embodiments, bus controller 120 may be configured to additionally store the count value in a memory.

In some embodiments, the VOUT communication path is a bus shared by some or all of the DC/DC converters 130. Accordingly, in the auto calibration mode, bus controller 120 may be configured to provide the counting signal for a particular one of the DC/DC converters 130 while causing the particular one DC/DC converter 130 to be active for example using one or more signals on the TEST communication path for the particular one DC/DC converter 130, and while causing the other DC/DC converters 130 to be inactive, for example, using one or more test signals on the TEST communication paths for the other DC/DC converters 130. Therefore, bus controller 120 may be configured to program the DC/DC converters 130 with offset compensating data one DC/DC converter 130 at a time in the auto calibration mode.

In some embodiments, bus controller 120 generates corresponding amplifier control signals which cause the DC/DC converters 130 to operate in a Dynamic Voltage Scaling mode.

During the Dynamic Voltage Scaling mode, the bus controller 120 may be configured to successively provide the VOUT communication path with a series of data words corresponding with a counting pattern. In addition, each of the DACs 132 is configured, for example by signals including, for example, a clock signal, received from bus controller 120, for example, on the TEST communication path, to generate an analog voltage at the output AOUT corresponding with the current count of the counting pattern on the VOUT communication path. In some embodiments, each of the DACs 132 may receive a clock signal and/or an enable signal from a source other than bus controller 120.

In some embodiments, bus controller 120 may be configured to stop changing the counting pattern in response to the counting pattern achieving a target value. In some embodiments, bus controller 120 may be configured to stop changing the counting pattern in response to the analog voltage generated by the DACs 132 becoming greater than or less than a threshold value.

In some embodiments, the VOUT communication path is a bus shared by some or all of the DC/DC converters 130. Accordingly, in the Dynamic Voltage Scaling mode, bus controller 120 may be configured to provide the counting signal for the DAC 132 of a particular one of the DC/DC converters 130 while causing the particular one DC/DC converter 130 to be active, for example, using one or more signals on the TEST communication path for the particular one DC/DC converter 130, and while causing the other DC/DC converters 130 to be inactive, for example, using one or more test signals on the TEST communication paths for the other DC/DC converters 130. Therefore, bus controller 120 may be configured to cause the DACs 132 to generate target analog voltages one DC/DC converter 130 at a time in the Dynamic Voltage Scaling mode.

In some embodiments, bus controller 120 generates corresponding amplifier control signals which cause the DC/DC converters 130 to operate in a Step by Step Voltage Scaling mode.

During the Step by Step Voltage Scaling mode, the bus controller 120 may be configured to successively provide the VOUT communication path with a series of data words corresponding with a counting pattern. In addition, each of the DACs 132 is configured, for example, by signals including, for example, a clock signal, received from bus controller 120, for example, on the TEST communication path, to generate an analog voltage at the output AOUT corresponding with the current count of the counting pattern on the VOUT communication path.

In some embodiments, the system controller 110 may be configured to provide a signal to bus controller 120 which causes bus controller 120 to generate the clock signal for the DC/DC converters 130 in the Step by Step Voltage Scaling mode. For example, in some embodiments, the system controller 110 generates a clock signal, and bus controller 120 uses the clock signal from system controller 110 to generate the clock signal for the DC/DC converters 130. In some embodiments, system controller 110 receives a signal which causes system controller 110 to generate the clock signal for bus controller 120. For example, in some embodiments, system controller 110 receives a clock signal on a power control input, such as a PWRCTRLx power control input. In some embodiments, while the clock signal on the power control input does not change, the bus controller 120 causes the current data word on the VOUT communication path to persist.

In some embodiments, bus controller 120 may be configured to stop changing the counting pattern in response to the counting pattern achieving a target value. In some embodiments, bus controller 120 may be configured to stop changing the counting pattern in response to the analog voltage generated by the DACs 132 becoming greater than or less than a threshold value.

In some embodiments, the VOUT communication path is a bus shared by some or all of the DC/DC converters 130. Accordingly, in the Step by Step Voltage Scaling mode, bus controller 120 may be configured to provide the counting pattern for the DAC 132 of a particular one of the DC/DC converters 130 while causing the particular one DC/DC converter 130 to be active, for example, using one or more signals on the TEST communication path for the particular one DC/DC converter 130, and while causing the other DC/DC converters 130 to be inactive, for example, using one or more test signals on the TEST communication paths for the other DC/DC converters 130. Therefore, bus controller 120 may be configured to cause the DACs 132 to generate step by step analog voltages one DC/DC converter 130 at a time in the Step by Step Voltage Scaling mode.

In some embodiments, bus controller 120 generates corresponding amplifier control signals which cause the DC/DC converters 130 to operate in a Read Calibration Word mode.

During a Read Calibration Word mode, bus controller 120 may be configured to successively provide the digital modules 136 with a series of data words corresponding with a counting pattern. In addition, each of the digital modules 136 is configured, for example, by signals received from bus controller 120 on the TEST communication path, to compare the current count with the stored offset correction data for the amplifier 134.

While the current count is not equal to the stored offset correction data, digital module 136 generates a signal on the TEST communication path for bus controller 120 indicating that the current count is not equal to the stored offset correction data. In contrast, when the current count is equal to the stored offset correction data, digital module 136 generates a signal on the TEST communication path for bus controller 120 indicating that the current count is equal to the stored offset correction data.

In response to receiving the signal indicating that the current count is equal to the stored offset correction data, bus controller 120 may be configured to store the current count in a memory, and to store an indication that the memory location storing the current count is storing the read calibration word for the particular DC/DC converter 130.

In some embodiments, the VOUT communication path is a bus shared by some or all of the DC/DC converters 130. Accordingly, in the Read Calibration Word mode, bus controller 120 may be configured to effectively read the stored calibration word of a particular one of the DC/DC converters 130 while causing the particular one DC/DC converter 130 to be active for example using one or more signals on the TEST communication path for the particular one DC/DC converter 130, and while causing the other DC/DC converters 130 to be inactive, for example, using one or more test signals on the TEST communication paths for the other DC/DC converters 130. Therefore, bus controller 120 may be configured to read the calibration words of the DC/DC converters 130 one at a time in the Read Calibration Word mode.

In some embodiments, bus controller 120 generates corresponding amplifier control signals which cause the DC/DC converters 130 to operate in a Force Calibration Word mode.

During a Force Calibration Word mode, bus controller 120 may be configured to program any of the digital modules 136 with a particular data word corresponding with a target calibration word value. In addition, each of the digital modules 136 is configured, for example, by signals received from bus controller 120 on the TEST communication path, to store the target calibration word value, and to provide the target calibration word value to the amplifier 134, where the target calibration word value affects the offset of the amplifier 134.

In some embodiments, the VOUT communication path is a bus shared by some or all of the DC/DC converters 130. Accordingly, in the Force Calibration Word mode, bus controller 120 may be configured to provide the target calibration word value to a particular one of the DC/DC converters 130 while causing the particular one DC/DC converter 130 to be active for example using one or more signals on the TEST communication path for the particular one DC/DC converter 130, and while causing the other DC/DC converters 130 to be inactive, for example, using one or more test signals on the TEST communication paths for the other DC/DC converters 130. Therefore, bus controller 120 may be configured to write the calibration words of the DC/DC converters 130 one at a time in the Force Calibration Word mode.

Figure 2:
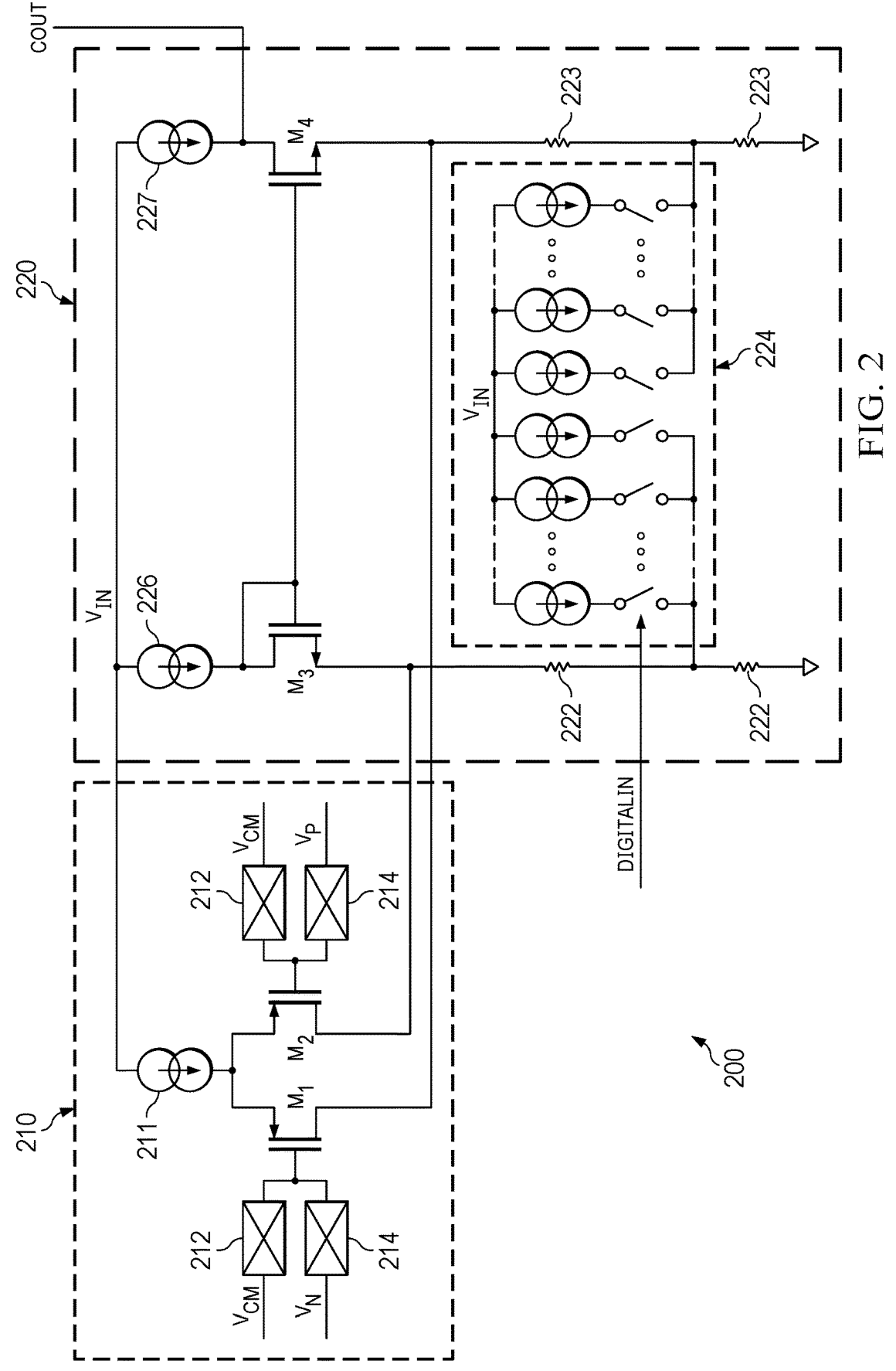
FIG. 2 shows a schematic circuit diagram of an amplifier or comparator used in the control system of FIG. 1 according to some embodiments.

FIG. 2 shows a schematic circuit diagram of an amplifier, such as comparator 200 used as amplifier 134 in the DC/DC converters 130 of the DC/DC converter system 100 of FIG. 1 according to some embodiments. Amplifier 200 includes first stage 210 and second stage 220. The illustrated embodiment provides an example, and is not meant to be limiting. Accordingly, other amplifier or comparator architectures may be used in the DC/DC converter system 100.

First stage 210 includes tail current source 211, and PMOS differential pair transistors M1 and M2. Differential pair transistors M1 and M2 are configured to receive a common mode voltage through coupling devices 212, and are configured to receive a differential signal across positive input VP and negative input VN through coupling devices 214. Coupling devices 212 and 214 may be any coupling device. For example, coupling devices 212 and 214 may be resistors or capacitors, or any combination of resistors and capacitors.

Differential pair transistors M1 and M2 are configured to steer the tail current sourced by tail current source 211 to second stage 220 based on a difference in the voltages at the gates of transistors M1 and M2.

Second stage 220 includes a first leg having current source 226, and MOS transistor M3, and load devices 222. Second stage 220 also includes a second leg having current source 227, and MOS transistor M4, and load devices 223.

The voltage at the source terminal of transistor M3 is affected by the resistances of load devices 222, the current from current source 226, the current from transistor M2, and any current from offset control circuit 224. Similarly, the voltage at the source terminal of transistor M4 is affected by the resistances of load devices 223, the current from current source 227, the current from transistor M1, and any current from offset control circuit 224.

If the voltage at the source terminal of transistor M4 is less than the voltage at the source terminal of transistor M3, the gate to source voltage of transistor M4 is greater than the threshold voltage of transistor M4, and transistor M4 is, accordingly, conductive. As a result, the voltage at the output COUT is reduced by the current conducted through transistor M4 and load devices 223.

If the voltage at the source terminal of transistor M4 is greater than the voltage at the source terminal of transistor and three, the gate to source voltage of transistor M4 is less than the threshold voltage of transistor M4, and M4 is, accordingly, nonconductive or less conductive. As a result, the voltage at the output COUT is increased by the current from current source 227.

To adjust for offset in the devices of amplifier 200, offset control circuit 224 receives a digital word controlling switches, which selectively add current to either or both of the first leg and the second leg. Adding current to the first leg causes the voltage at the source terminal of transistor M3 to increase. Adding current to the second leg causes the voltage at the source terminal of transistor M4 to increase.

Amplifier 200 may be used in a calibration mode, such as the auto calibration mode discussed elsewhere herein. For example, in response to the digital input, current may be added to either or both of the first and second legs. For example, the differential input may be set to zero, and the digital input may sequentially increase in a counting sequence from an extreme high value or from an extreme low value. In response to a particular value in the counting sequence, the output voltage at output COUT switches from a high value to a low value or from a low value to a high value. The particular value in the counting sequence causing the switch, or in some embodiments, the value immediately preceding the particular value, may be used as an offset calibration word for the amplifier 200.

Figure 3:
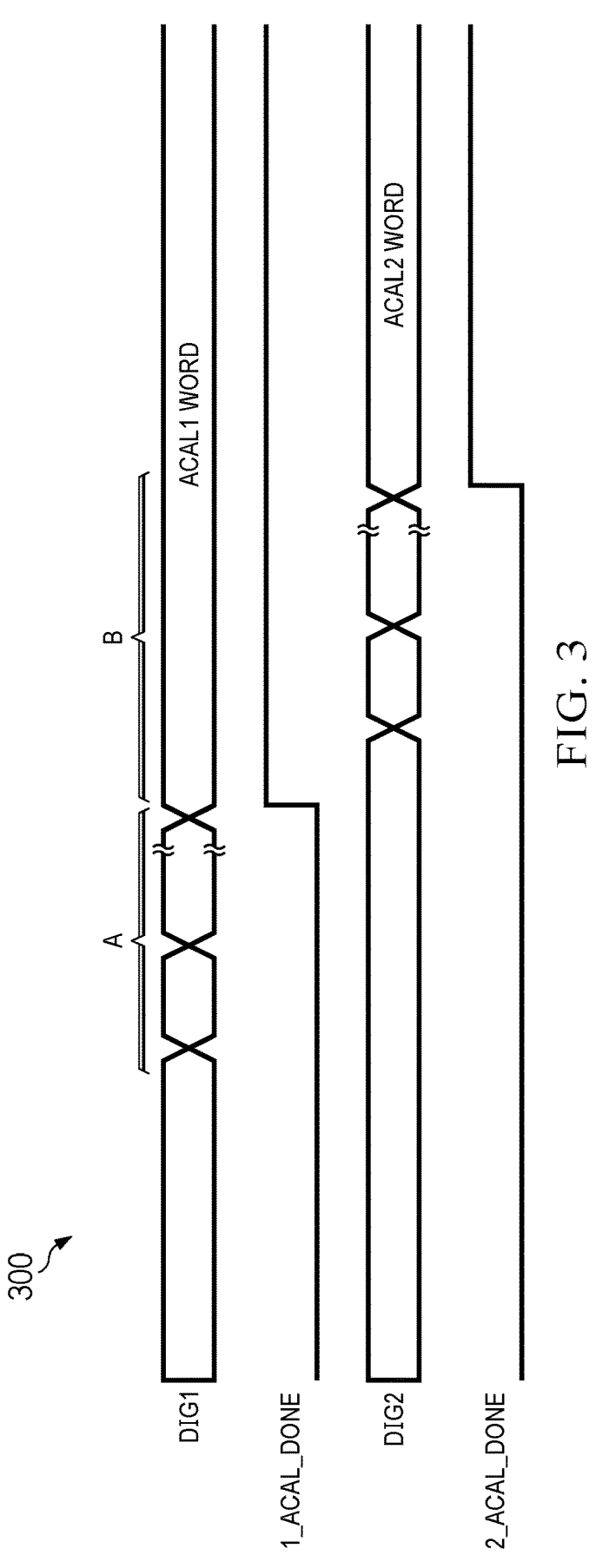
FIG. 3 shows a waveform diagram illustrating a method of using a DC/DC converter system according to some embodiments.

FIG. 3 shows a waveform diagram 300 illustrating a method of using a DC/DC converter system according to some embodiments. Waveform diagram 300 illustrates a DC/DC converter system being used in an auto calibration mode. During the auto-calibration mode, first and second (or more) amplifiers are calibrated for offset.

In some embodiments, while in the auto-calibration mode, a bus controller, such as bus controller 120, may transmit data to the first and second DC/DC converters identifying the auto-calibration mode. In addition, the controller may generate signals which cause the inputs of first and second amplifiers of the first and second DC/DC converters to be shorted.

In addition, during a first portion A of an auto calibration sequency, the bus controller may transmit data to a first DC/DC converter identifying the auto calibration mode. The bus controller may also program a first digital module, such as digital module 136, with a series of data words corresponding with a counting pattern, as shown in waveform DIG1. The bus controller may, for example, transmit the data words to the first digital module using a bus, common to all of the DC/DC converters. The first digital module affects the offset of a first amplifier, such as amplifier 134. In response to a current count changing to a value corresponding with the voltage offset of the first amplifier, the voltage output of the first amplifier changes from its initial high or low voltage output value to an opposite low or high voltage value. The bus controller may be configured to monitor the output of the first amplifier, and to stop changing the data word for the digital module in response to a signal, as shown in waveform 1_ACAL_DONE, indicating that the output of the first amplifier has changed. As a result, the count value corresponding with and compensating for the offset voltage of the first amplifier persists in the first digital module associated therewith. In some embodiments, the bus controller may be configured to additionally store the count value of the first digital module in a memory in response to the 1_ACAL_DONE signal.

Furthermore, during a second portion B of the auto calibration sequency, the bus controller programs a second digital module, such as digital module 136, with a series of data words corresponding with a counting pattern, as shown in waveform DIG2. The bus controller may, for example, transmit the data words to the second digital module using the bus common to all of the DC/DC converters. The second digital module affects the offset of a second amplifier, such as amplifier 134. In response to a current count changing to a value corresponding with the voltage offset of the second amplifier, the voltage output of the second amplifier changes from its initial high or low voltage output value to an opposite low or high voltage value. The bus controller may be configured to monitor the output of the second amplifier, and to stop changing the data word for the second digital module in response to a signal, as shown in waveform 2_ACAL_DONE, indicating that the output of the second amplifier has changed. As a result, the count value corresponding with and compensating for the offset voltage of the second amplifier persists in the digital module associated therewith. In some embodiments, the bus controller may be configured to additionally store the count value for the second digital module in a memory in response to the 2_ACAL_DONE signal.

In the illustrated embodiment, a linear search is performed to determine the offset calibration word. In alternative embodiments, a binary search, or another search pattern may be used.

Figure 4:
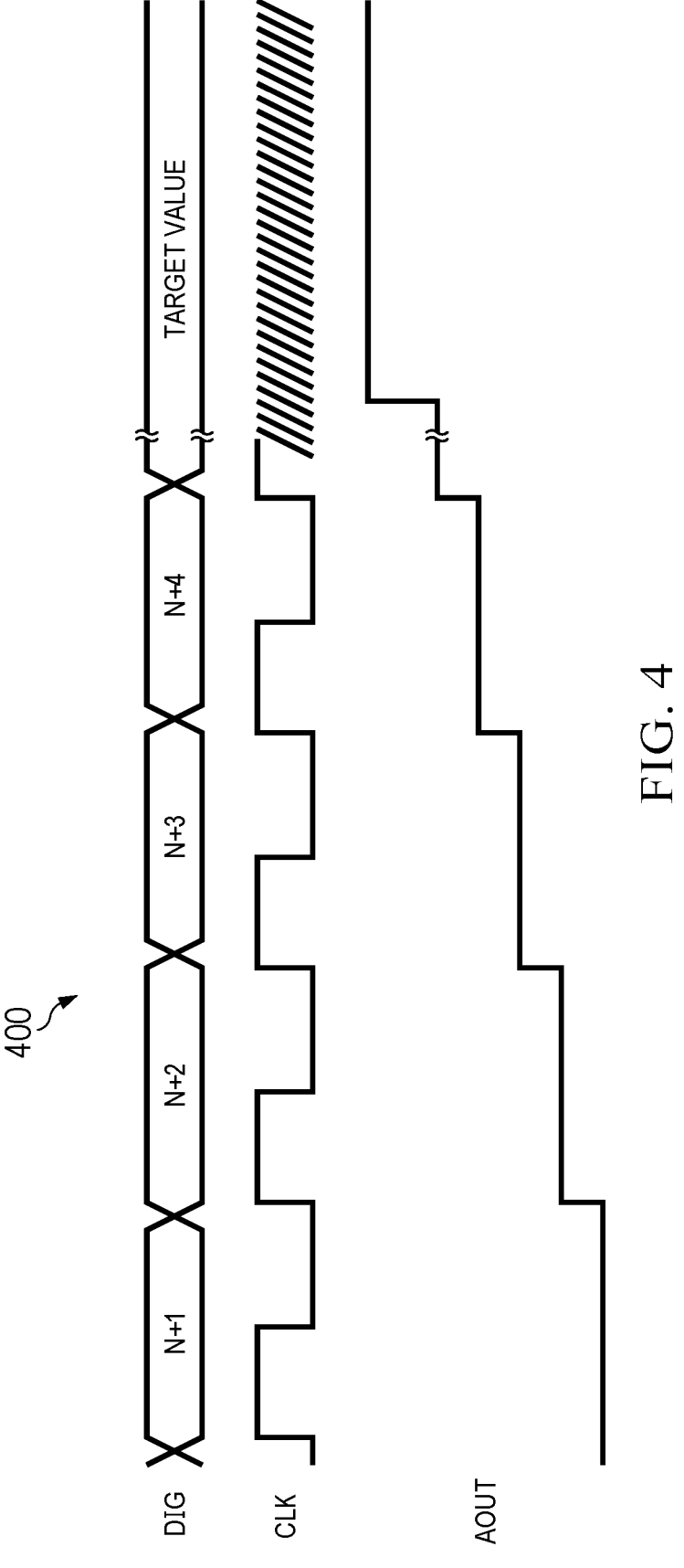
FIG. 4 shows a waveform diagram illustrating a method of using a DC/DC converter system according to some embodiments.

FIG. 4 shows a waveform diagram 400 illustrating a method of using a DC/DC converter system according to some embodiments. Waveform diagram 400 illustrates a DC/DC converter system being used in a Dynamic Voltage Scaling mode. During the Dynamic Voltage Scaling mode, a DAC of a particular DC/DC converter generates a sequence of analog output voltages.

In some embodiments, while in Dynamic Voltage Scaling mode, a bus controller, such as bus controller 120, may transmit data to the particular DC/DC converter identifying the Dynamic Voltage Scaling mode. In addition, the controller may generate signals which cause the DAC of the particular DC/DC converter to generate a sequence of analog output voltages, illustrated as AOUT.

During the Dynamic Voltage Scaling mode, the bus controller may be configured to successively provide a series of data words, illustrated as DIG, corresponding with a counting pattern to the particular DC/DC converter using the bus common to all of the DC/DC converters. In addition, the DAC of the particular DC/DC converter is configured, for example by signals including, for example, a clock signal, illustrated as CLK, received from the bus controller, to generate an analog voltage corresponding with the current count of the counting pattern on the bus. In some embodiments, the DAC may receive a clock signal and/or an enable signal from a source other than the bus controller.

In some embodiments, the bus controller may be configured to stop changing the counting pattern in response to the counting pattern achieving a target value. In some embodiments, the bus controller may be configured to stop changing the counting pattern in response to the analog voltage generated by the DAC becoming greater than or less than a threshold value.

Figure 5:
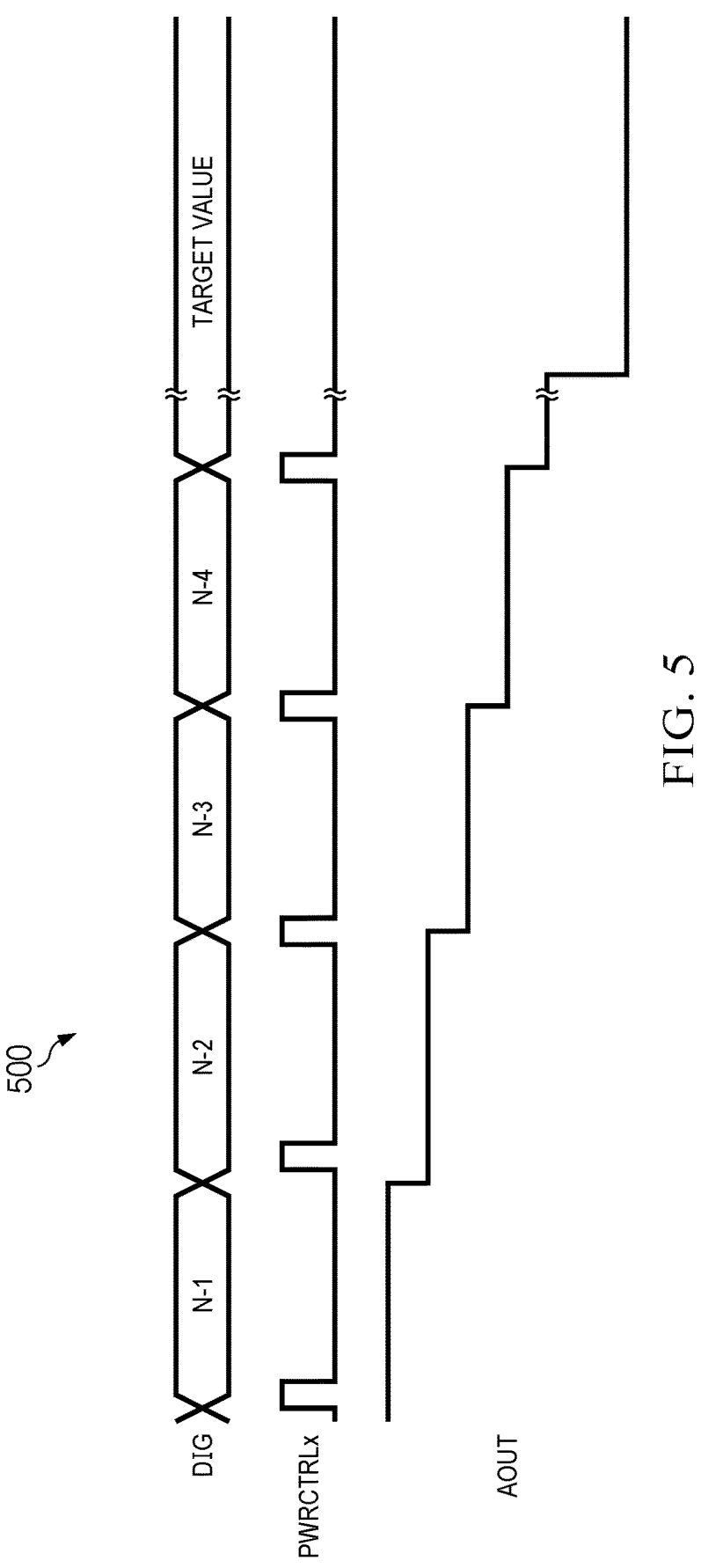
FIG. 5 shows a waveform diagram illustrating a method of using a DC/DC converter system according to some embodiments.

FIG. 5 shows a waveform diagram 500 illustrating a method of using a DC/DC converter system according to some embodiments. Waveform diagram 500 illustrates a DC/DC converter system being used in a Step by Step Voltage Scaling mode. During the Step by Step Voltage Scaling mode, a DAC of a particular DC/DC converter generates a sequence of analog output voltages in response to an externally applied clock signal.

In some embodiments, while in Step by Step Voltage Scaling mode, a bus controller, such as bus controller 120, may transmit data to the particular DC/DC converter identifying the Step by Step Voltage Scaling mode. In addition, the controller may generate signals which cause the DAC of the particular DC/DC converter to generate a sequence of analog output voltages, illustrated as AOUT.

During the Step by Step Voltage Scaling mode, the bus controller may be configured to successively provide a series of data words, illustrated as DIG, corresponding with a counting pattern to the particular DC/DC converter using a bus common to all of the DC/DC converters. In addition, the DAC of the particular DC/DC converter is configured, for example by signals including, for example, a clock signal, illustrated as CLK, received from the bus controller, to generate an analog voltage corresponding with the current count of the counting pattern on the bus. In some embodiments, the DAC may receive a clock signal and/or an enable signal from a source other than the bus controller.

In some embodiments, a system controller, such as system controller 110 may be configured to provide a signal to the bus controller which causes the bus controller to generate the clock signal for the particular DC/DC converter in the Step by Step Voltage Scaling mode. For example, in some embodiments, the system controller generates a clock signal, and the bus controller uses the clock signal from system controller to generate the clock signal for the particular DC/DC converter. In some embodiments, system controller receives a signal which causes the system controller to generate the clock signal for the bus controller. For example, in some embodiments, the system controller receives a clock signal on a power control input, such as a PWRCTRLx power control input. In some embodiments, while the clock signal on the power control input does not change, the bus controller causes the current data word on the bus to persist.

In some embodiments, the bus controller may be configured to stop changing the counting pattern in response to the counting pattern achieving a target value. In some embodiments, the bus controller may be configured to stop changing the counting pattern in response to the analog voltage generated by the DAC becoming greater than or less than a threshold value.

Figures 6, 7:
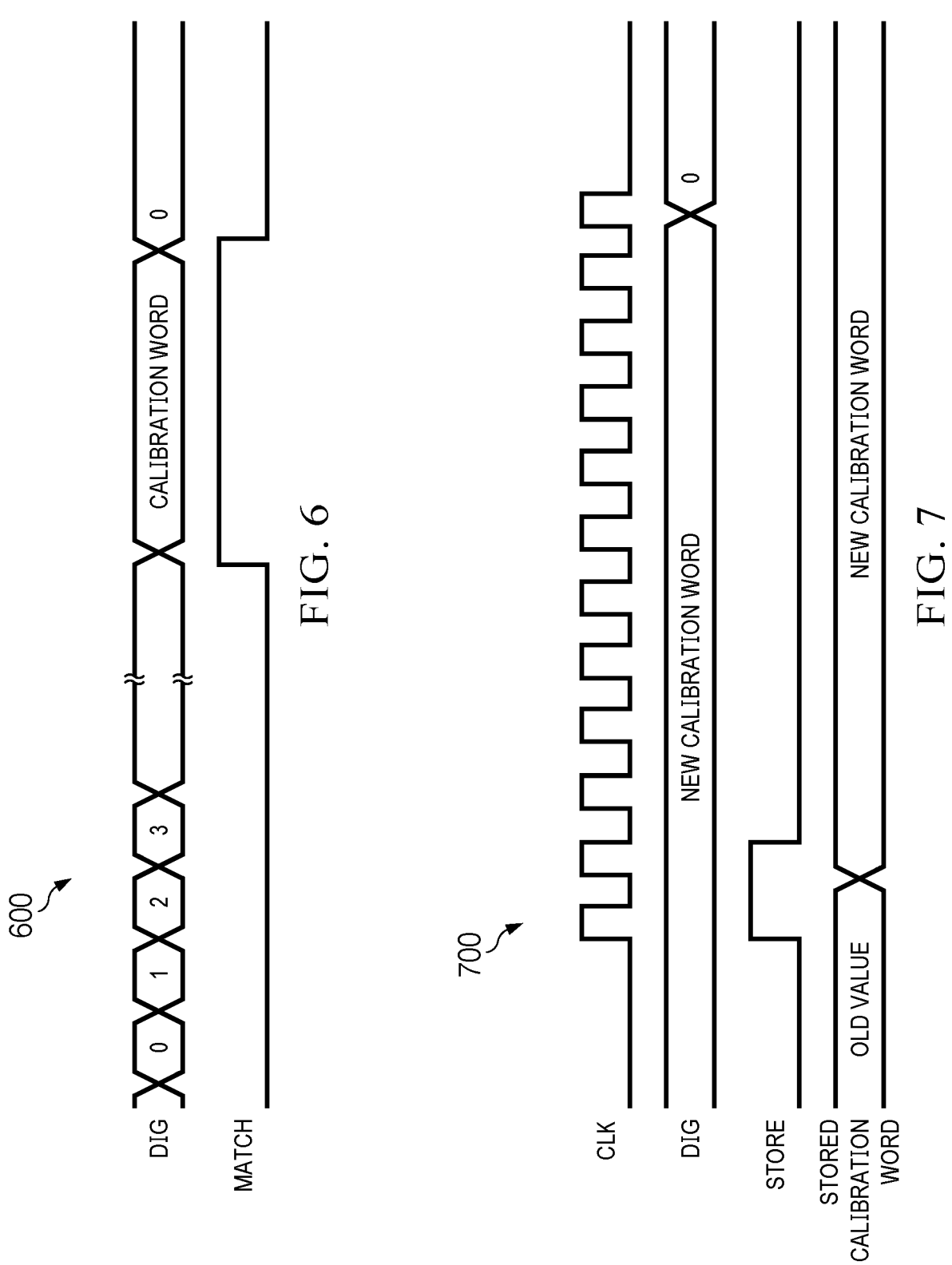
FIG. 6 shows a waveform diagram illustrating a method of using a DC/DC converter system according to some embodiments.
FIG. 7 shows a waveform diagram illustrating a method of using a DC/DC converter system according to some embodiments.

FIG. 6 shows a waveform diagram 600 illustrating a method of using a DC/DC converter system according to some embodiments. Waveform diagram 600 illustrates a DC/DC converter system being used in a Read Calibration Word mode. During the Read Calibration Word mode, an offset calibration word of a particular DC/DC converter is determined.

In some embodiments, while in Read Calibration Word mode, a bus controller, such as bus controller 120, may transmit data to the particular DC/DC converter identifying the Read Calibration Word mode. In addition, the controller may generate signals which cause the particular DC/DC converter to provide an indication identifying the current calibration word of the digital module of the particular DC/DC converter.

During the Read Calibration Word mode, the bus controller may be configured to successively provide a series of data words, illustrated as DIG, corresponding with a counting pattern to the particular DC/DC converter using a bus common to all of the DC/DC converters. In addition, the digital module of the particular DC/DC converter may be configured, for example by signals including, for example, a clock signal, to compare the current count on the bus with the stored offset correction data for the amplifier of the particular DC/DC converter.

While the current count is not equal to the stored offset correction data, the digital module generates a signal, illustrated as MATCH, for the bus controller indicating that the current count is not equal to the stored offset correction data. However, when the current count is equal to the stored offset correction data, the digital module causes the MATCH signal to indicate that the current count is equal to the stored offset correction data.

In response to receiving the MATCH signal indicating that the current count is equal to the stored offset correction data, the bus controller may be configured to store the current count in a memory, and, in some embodiments, to store an indication that the memory location storing the current count is storing the read calibration word for the particular DC/DC converter.

FIG. 7 shows a waveform diagram 700 illustrating a method of using a DC/DC converter system according to some embodiments. Waveform diagram 700 illustrates a DC/DC converter system being used in Force Calibration Word mode. During the Force Calibration Word mode, an offset calibration word of a particular DC/DC converter is programed with a particular value.

During the Force Calibration Word mode, the bus controller may be configured to provide a of data word, illustrated as DIG, corresponding with a particular calibration value to the particular DC/DC converter using a bus common to all of the DC/DC converters. In addition, the digital module of the particular DC/DC converter may be configured, for example by signals including, for example, a signal, indicated as STORE, to store the particular calibration value on the bus for use in calibrating an offset of the amplifier of the particular DC/DC converter. In some embodiments, the store operation is synchronized with a clock signal, illustrated as CLK. In the figure, the change in stored calibration words is indicated with the waveform illustrated as "stored calibration word."

Examples of the present invention are summarized here. Other examples can also be understood from the entirety of the specification and the claims.

Example 1. One embodiment is a converter system, including a system controller; a plurality of circuit elements configured to operate in response to control signals from the system controller; a bus controller configured to transmit data to a communication bus; and a plurality of power converters, each including a digital to analog converter (DAC) configured to generate an analog voltage for one or more of the circuit elements based on a digital signal on the communication bus; a digital module configured to receive digital data from the bus controller on the communication bus; and an amplifier, configured to adjust an offset according to an offset compensation code received from the digital module.

Example 2. The converter system of example 1, where the amplifier includes a plurality of current sources configured to affect the offset based on the offset compensation code.

Example 3. The converter system of example 1, where the bus controller is configured to transmit first and second digital words to the communication bus for the digital module of a first power converter, the second digital word causing an output of the amplifier of the first power converter to change, and where the digital module of the first power converter is configured to store the second digital word as a consequence of the output of the amplifier of the first power converter changing.

Example 4. The converter system of example 1, where the bus controller is configured to transmit a series of data words corresponding with a counting pattern to the communication bus for the digital module of a first power converter, the series of data words causing the DAC of the first power converter to generate an analog voltage ramp according to a clock signal.

Example 5. The converter system of example 4, where the clock signal is generated in response to a signal received at a power control input of the system controller.

Example 6. The converter system of example 1, where the bus controller is configured to transmit a series of data words to the communication bus for the digital module of a first power converter, where the digital module of the first power converter is configured to provide an indication to the bus controller regarding whether each data word of the series is equal to the offset compensation code.

Example 7. The converter system of example 1, where the bus controller is configured to transmit a data word to the communication bus for the digital module of a first power converter, where the digital module of the first power converter is configured to store the data word as the offset compensation code.

Example 8. Another embodiment is a converter system, including a bus controller configured to transmit data to a communication bus; and a plurality of power converters, each including a digital to analog converter (DAC) configured to generate an analog voltage based on a digital signal on the communication bus; a digital module configured to receive digital data from the bus controller on the communication bus; and an amplifier, configured to adjust an offset according to an offset compensation code received from the digital module.

Example 9. The converter system of example 8, where the amplifier includes a plurality of elements configured to affect the offset based on the offset compensation code.

Example 10. The converter system of example 8, where the bus controller is configured to transmit first and second digital words to the communication bus for the digital module of a first power converter, the second digital word causing an output of the amplifier of the first power converter to change, and where the digital module of the first power converter is configured to store the second digital word as a consequence of the output of the amplifier of the first power converter changing.

Example 11. The converter system of example 8, where the bus controller is configured to transmit a series of data words corresponding with a counting pattern to the communication bus for the digital module of a first power converter, the series of data words causing DAC of the first power converter to generate an analog voltage ramp according to a clock signal.

Example 12. The converter system of example 11, further including first and second circuit elements configured to respectively receive first and second analog voltages from the first power converter and from a second power converter of the plurality of power converters; and a system controller, configured to influence operation of the first and second circuit elements, where the clock signal is generated in response to a signal received at a power control input of the system controller.

Example 13. The converter system of example 8, where the bus controller is configured to transmit a series of data words to the communication bus for the digital module of a first power converter, where the digital module of the first power converter is configured to provide an indication to the bus controller regarding whether each data word of the series is equal to the offset compensation code.

Example 14. The converter system of example 8, where the bus controller is configured to transmit a data word to the communication bus for the digital module of a first power converter, where the digital module of the first power converter is configured to store the data word as the offset compensation code.

Example 15. Another embodiment is a method of using a converter system, the method including causing a plurality of circuit elements to operate in response to control signals from a system controller; transmitting data to a communication bus for a plurality of data converters connected to the communication bus; and with each of a plurality of power converters generating an analog voltage for one or more of the circuit elements based on a digital signal on the communication bus; and adjusting an offset of an amplifier according to an offset compensation code received from the communication bus.

Example 16. The method of example 15, further including transmitting first and second digital words to the communication bus for a first power converter, the second digital word causing an output of the amplifier of the first power converter to change; and storing the second digital word as a consequence of the output of the amplifier of the first power converter changing.

Example 17. The method of example 15, further including transmitting a series of data words corresponding with a counting pattern to the communication bus for a first power converter; and generating an analog voltage ramp based on the series of data words according to a clock signal.

Example 18. The method of example 17, further including generating the clock signal in response to a signal received at a power control input of the system controller.

Example 19. The method of example 15, further including transmitting a series of data words to the communication bus for a first power converter; and providing an indication regarding whether each data word of the series is equal to the offset compensation code.

Example 20. The method of example 15, further including transmitting a data word to the communication bus for a digital module of a first power converter; and with the digital module of the first power converter, storing the data word as the offset compensation code.

While this invention has been described with reference to illustrative implementations, this description is not intended to be construed in a limiting sense. Various modifications and combinations of the illustrative implementations, as well as other implementations of the invention, will be apparent to persons skilled in the art upon reference to the description. It is therefore intended that the appended claims encompass any such modifications or implementations.

What is claimed is:

1. A converter system, comprising:
a system controller;
a plurality of circuit elements configured to operate in response to control signals from the system controller;
a bus controller configured to transmit data to a communication bus; and
a plurality of power converters, each comprising:
a digital to analog converter (DAC) configured to generate an analog voltage for one or more of the circuit elements based on a digital signal on the communication bus;
a digital module configured to receive digital data from the bus controller on the communication bus; and
an amplifier configured to adjust an offset according to an offset compensation code received from the digital module.

2. The converter system of claim 1, wherein the amplifier comprises a plurality of current sources configured to affect the offset based on the offset compensation code.

3. The converter system of claim 1, wherein the bus controller is configured to transmit first and second digital words to the communication bus for the digital module of a first power converter, the second digital word causing an output of the amplifier of the first power converter to change, and wherein the digital module of the first power converter is configured to store the second digital word as a consequence of the output of the amplifier of the first power converter changing.

4. The converter system of claim 1, wherein the bus controller is configured to transmit a series of data words corresponding with a counting pattern to the communication bus for the digital module of a first power converter, the series of data words causing the DAC of the first power converter to generate an analog voltage ramp according to a clock signal.

5. The converter system of claim 4, wherein the clock signal is generated in response to a signal received at a power control input of the system controller.

6. The converter system of claim 1, wherein the bus controller is configured to transmit a series of data words to the communication bus for the digital module of a first power converter, wherein the digital module of the first power converter is configured to provide an indication to the bus controller regarding whether each data word of the series is equal to the offset compensation code.

7. The converter system of claim 1, wherein the bus controller is configured to transmit a data word to the communication bus for the digital module of a first power converter, wherein the digital module of the first power converter is configured to store the data word as the offset compensation code.

8. A converter system, comprising:
a bus controller configured to transmit data to a communication bus; and
a plurality of power converters, each comprising:
a digital to analog converter (DAC) configured to generate an analog voltage based on a digital signal on the communication bus;
a digital module configured to receive digital data from the bus controller on the communication bus; and
an amplifier configured to adjust an offset according to an offset compensation code received from the digital module.

9. The converter system of claim 8, wherein the amplifier comprises a plurality of elements configured to affect the offset based on the offset compensation code.

10. The converter system of claim 8, wherein the bus controller is configured to transmit first and second digital words to the communication bus for the digital module of a first power converter, the second digital word causing an output of the amplifier of the first power converter to change, and wherein the digital module of the first power converter is configured to store the second digital word as a consequence of the output of the amplifier of the first power converter changing.

11. The converter system of claim 8, wherein the bus controller is configured to transmit a series of data words corresponding with a counting pattern to the communication bus for the digital module of a first power converter, the series of data words causing the DAC of the first power converter to generate an analog voltage ramp according to a clock signal.

12. The converter system of claim 11, further comprising:
first and second circuit elements configured to respectively receive first and second analog voltages from the first power converter and from a second power converter of the plurality of power converters; and
a system controller, configured to influence operation of the first and second circuit elements, wherein the clock signal is generated in response to a signal received at a power control input of the system controller.

13. The converter system of claim 8, wherein the bus controller is configured to transmit a series of data words to the communication bus for the digital module of a first power converter, wherein the digital module of the first power converter is configured to provide an indication to the bus controller regarding whether each data word of the series is equal to the offset compensation code.

14. The converter system of claim 8, wherein the bus controller is configured to transmit a data word to the communication bus for the digital module of a first power converter, wherein the digital module of the first power converter is configured to store the data word as the offset compensation code.

15. A method of using a converter system, the method comprising:

causing a plurality of circuit elements to operate in response to control signals from a system controller;

transmitting data to a communication bus for a plurality of data converters connected to the communication bus; and with each of a plurality of power converters:

generating an analog voltage for one or more of the circuit elements based on a digital signal on the communication bus; and adjusting an offset of an amplifier according to an offset compensation code received from the communication bus.

16. The method of claim 15, further comprising:

transmitting first and second digital words to the communication bus for a first power converter, the second digital word causing an output of the amplifier of the first power converter to change; and storing the second digital word as a consequence of the output of the amplifier of the first power converter changing.

17. The method of claim 15, further comprising:

transmitting a series of data words corresponding with a counting pattern to the communication bus for a first power converter; and generating an analog voltage ramp based on the series of data words according to a clock signal.

18. The method of claim 17, further comprising generating the clock signal in response to a signal received at a power control input of the system controller.

19. The method of claim 15, further comprising:

transmitting a series of data words to the communication bus for a first power converter; and providing an indication regarding whether each data word of the series is equal to the offset compensation code.

20. The method of claim 15, further comprising:

transmitting a data word to the communication bus for a digital module of a first power converter; and with the digital module of the first power converter, storing the data word as the offset compensation code.

\* \* \* \* \*